(12) United States Patent
Kambara et al.

(10) Patent No.: US 7,667,975 B2
(45) Date of Patent: Feb. 23, 2010

(54) LIGHTING DEVICE OF DISCHARGE LAMP, ILLUMINATION APPARATUS AND ILLUMINATION SYSTEM

(75) Inventors: Yasushi Kambara, Kadoma (JP); Akira Motoyama, Kadoma (JP); Masayuki Nakajima, Kadoma (JP)

(73) Assignee: Matsushita Electric Works, Ltd., Osaka (JP)

( * ) Notice: Subject to any disclaimer, the term of this patent is extended or adjusted under 35 U.S.C. 154(b) by 625 days.

(21) Appl. No.: 10/580,071

(22) PCT Filed: Dec. 15, 2004

(86) PCT No.: PCT/IB2004/004120

§ 371 (c)(1),
(2), (4) Date: May 19, 2006

(87) PCT Pub. No.: WO2005/064228

PCT Pub. Date: Jul. 14, 2005

(65) Prior Publication Data

US 2007/0103879 A1 May 10, 2007

(30) Foreign Application Priority Data

Dec. 22, 2003 (JP) ............................. 2003-425035

(51) Int. Cl.
*H05K 7/00* (2006.01)

(52) U.S. Cl. ...................................... 361/760; 174/261

(58) Field of Classification Search ................. 361/763, 361/301, 306–310, 760; 29/25.42; 174/261
See application file for complete search history.

(56) References Cited

U.S. PATENT DOCUMENTS

| 4,158,218 A | | 6/1979 | McLurin et al. ............. 361/308 |
| 4,534,032 A | * | 8/1985 | Hoag .......................... 372/34 |
| 4,578,737 A | | 3/1986 | Westermann ............... 361/308 |
| 4,646,197 A | * | 2/1987 | Wong ......................... 361/307 |
| 6,235,371 B1 | * | 5/2001 | Mitsuhashi et al. ......... 428/141 |
| 6,909,246 B2 | | 6/2005 | Hein .......................... 315/248 |
| 6,917,512 B2 | * | 7/2005 | Hongu et al. ............... 361/319 |
| 7,405,920 B2 | * | 7/2008 | Uematsu et al. ............ 361/303 |
| 2007/0139860 A1 | * | 6/2007 | Hoerpel et al. ............. 361/311 |

FOREIGN PATENT DOCUMENTS

| JP | 5-217799 | 8/1993 |
| JP | 08-329731 | 12/1996 |
| JP | 8-329791 | 12/1996 |

(Continued)

*Primary Examiner*—Jinhee J Lee
*Assistant Examiner*—Yuriy Semenenko
(74) *Attorney, Agent, or Firm*—J.C. Patents

(57) ABSTRACT

A lighting device for a lamp device is provided. The lighting device includes a circuit board and film capacitors packaged on the circuit board by using leadless flow solders. Each film capacitor comprises polypropylene films and lead wires, and a material of the lead wires has a thermal conductivity lower than a thermal conductivity of copper, and terminals and internal materials of the film capacitors are leadless. A diameter of the lead wires is 0.6– (mm) or less, a cross-sectional area is 35 mm² or less, and a temperature at a terminal end of the lead wires in the film capacitors during a soldering process is 130° C. or less.

15 Claims, 7 Drawing Sheets

FOREIGN PATENT DOCUMENTS

| | | |
|---|---|---|
| JP | 09-050934 | 2/1997 |
| JP | 09-082562 | 3/1997 |
| JP | 10-119126 | 5/1998 |
| JP | 10-156939 | 6/1998 |
| JP | 10-270285 | 10/1998 |
| JP | 2001-230151 | 8/2001 |
| JP | 2003-003223 | 1/2003 |
| JP | 2003-133163 | 5/2003 |
| JP | 2003-243597 | 8/2003 |
| WO | WO 0197572 | 12/2001 |

* cited by examiner

LIGHTING DEVICE OF DISCHARGE LAMP, ILLUMINATION APPARATUS AND ILLUMINATION SYSTEM

CROSS-REFERENCE TO RELATED APPLICATION

This application claims the priority benefit of Japanese application serial no. JP 2003-425035, filed on Dec. 22, 2003.

BACKGROUND OF THE INVENTION

1. Field of the Invention

This invention relates in general to a lighting device of a discharge lamp, and an illumination apparatus using the lighting device.

2. Description of Related Art

In a conventional inverter lighting device, such as the one described in a disclosure in Japanese Laid Open H08-329731, film capacitors installed in electronic devices are subjected to thermal degradation due to heat generated by some electronic parts that will create heat in an operation. Ultimately, the lifetime of these film capacitors is shortened and their performance is changed. As a result, efforts are made to design a thermal shield to shield hybrid ICs or the layout of the circuit elements, so as to mitigate the thermal influence caused by the heat-creating parts.

Accordingly, a long-term use of a lighting device of a discharge lamp has to be considered. Therefore, a proper arrangement for the circuit parts must be examined so that the thermal influence can be reduced. Moreover, a film capacitor using a polyethylene terephthalate film having a high thermal resistance is also used.

However, for a capacitor using the polyethylene terephthalate film, the defective portions are removed by self-healing in an initial stage of dielectric breakdown. At the end of the lifetime of the capacitor, a short circuit or melting of the film is likely to occur, which becomes a problem for such capacitor. For capacitors made with a metallized film, self-healing or "clearing" can remove a fault or a short circuit in the dielectric film by vaporizing the metallization near the defect. The metallization is so thin that a negligible damage to the film is incurred during the clearing process. The vaporized metal oxidizes over time, aiding in the isolation of a fault area.

In order to solve the aforementioned problems, a capacitor with a polypropylene film is used. For example, the Japanese Laid Open Publication 10-119126 discloses a biaxial polypropylene film and a metallized polypropylene film to enhance the heat resistance and the properties formed by vapor deposition of these films by specifying an isotacticity and an isotactic pentad ratio. In addition, the Japanese Laid Open Publication 05-217799 discloses a vapor-deposited metallized film capacitor to obtain a vapor-deposited metallized film capacitor having excellent winding characteristics, excellent durability and heat resistance by providing a high rigidity vapor-deposited metallized film, formed by vapor-depositing a metal on a high rigidity polypropylene film. The Japanese Laid Open Publication 05-217799 discloses a polypropylene film capacitor to enhance long-term dielectric breakdown characteristics at high temperature and to suppress the deterioration in yield at a time of the production of a capacitor by specifying an isotacticity and an isotactic pendant ratio and a surface orientation coefficient of a biaxial polypropylene film. However, the polypropylene film will contract due to heat at the end of the capacitor's lifetime. The polypropylene film capacitor is easily affected by heat since the contraction temperature of the polypropylene film capacitor is lower than that of the polyethylene terephthalate film capacitor.

Additionally, in order to mitigate the negative impact on the environment, a leadless technology is developed, i.e., no lead is included in the solder components of a circuit board. Materials having a high melting point are widely used as the solder components. As a result, a preheating temperature prior to the soldering process and a soldering dip temperature are increased, and the film capacitor is affected by the heat during a solder packaging process. The use of the polypropylene film becomes more difficult. Moreover, for a capacitor using a polypheylene sulfide (PPS) film that has a high thermal-resistant temperature, the PPS film does not have a high isolation voltage and its cost is very high.

FIG. 1 shows a temperature profile of a film capacitor during a soldering process and temperature increases at different positions of the film capacitor. FIG. 2 shows the positions on one electrode of the film capacitor where a thermal couple for measuring the temperature of the film capacitor is attached. In FIG. 1, the film capacitor uses a copper wire as its lead wires. In FIG. 2, a side view of the film capacitor 1 with one lead wire 2 is shown. The positions where the thermal couple is attached are labeled with a, b, and c. The temperature curves I, II and III in FIG. 1 respectively show the temperature profiles corresponding to the positions a, b and c.

In the experiment, the temperature profiles (curves I, I, III) in FIG. 1 show that after preheating at 120° C. for 90 seconds, the film capacitor 1 is lifted and then dipped in a soldering tank at 260° C. for 7 seconds. As shown in FIG. 1, when the copper wire is used as the lead wires 2, the temperature at the terminal end b of the film capacitor 1 rises up to about 150° C., in which the terminal end is referred to one end of the lead wire 2 that is attached to the film capacitor. In general, since the highest operating temperature (for a rated reduction use) of the polypropylene capacitor is 105° C., the polypropylene film of the film capacitor under 150° C. will have a large thermal contraction. Thus the capacitance of the film capacitor is reduced under this situation. If the film capacitor is kept in use, the capacitance of the film capacitor would be further reduced. This mechanism will be described below by using a metallized polypropylene film capacitor as an example.

FIG. 3A shows a perspective appearance of a film capacitor, and FIG. 3B is a perspective view showing an internal structure of the film capacitor. FIG. 4 is a cross-sectional view showing the internal structure of the film capacitor. Referring to FIGS. 3A, 3B and 4, the film capacitor 1 comprises two metallized films, metallic contacts 5 and lead wires 2, wherein each metallized film includes a film 3 and a metal layer 4 deposited on the film 3. Each film 3 is not fully deposited with the metal layer 4, and a portion of the film is exposed at one side. The two metallized films are stacked and then wound in a manner that the exposed portion of the films 3 are arranged in parallel at opposition direction, as shown in FIGS. 3B and 4.

Referring to FIG. 4, after the metallized films are wound, the metallic contacts 5 are formed by respectively spraying metal material onto two side faces of the wound metallized films and the metallic contacts 5 are thus served as electrodes of the film capacitor 1. Each metal layer 4 formed on the film 3 would be electrically connected to one metallized contact 5. The film 3 is a dielectric film and can use a polypropylene film which thermal contraction is large. Therefore, the metal layers 4 and the film 3 sandwiched therebetween form a capacitor. The two lead wires 2 are respectively coupled to the metallic contacts 5, through which the film capacitor can be mounted onto a circuit board. A resistance of the film capacitor 1 is a combination of a resistance of the lead wires 2 and the metallic contacts 5, a resistance of the metallic contacts 5 and the films and a resistance of the deposited metal layers 4, etc., which can be represented by a parameter tan δ. The parameter tan δ represents a dielectric dissipation factor, which is one of the capacitor properties. A dielectric dissipation factor is defined as cotangent of a phase angle or tangent of a loss angle for a dielectric material. Since the metallic contacts 5 are formed by spraying, the thickness of the metallic contacts 5 is not easily controlled to be uniform. Therefore, the resistance between the metallized contact 5 and the film 3 is easily unstable.

If the temperature during the soldering of the film capacitor 1 is high, the polypropylene film 3 will contract and an adhesion between the films 3 and the metallic contacts 5 will deteriorate further. As a result, the contact resistance will increase. In this situation, when a current is conducted to pass through the film capacitor, a portion of the film capacitor, where the contact resistance is increased, start generating heat, and the temperature is increased. As the temperature exceeds 105° C. for a long time, the thermal contraction of the polypropylene becomes large, and the adhesion between the films 3 and the metallic contacts 5 becomes worse. Therefore, the resistance of the film capacitor 1 is increased and the contraction is accelerated. Due to the contraction of the polypropylene film, an effective area of the polypropylene film of the film capacitor 1, which is sandwiched between two deposited metal layers 4, is reduced. Thus, the capacitance of the film capacitor is decreased.

In order to be cost effective and safe, the aforementioned polypropylene film capacitor can be used in a lighting device of a discharge lamp. However, a solution of how to reduce the effects of temperature and heat during the soldering process is a key issue.

SUMMARY OF THE INVENTION

According to the foregoing description, an object of this invention is to provide a safe lighting device for a lamp device, such as a discharge lamp. This lighting device is highly reliable, low in cost, and can mitigate any negative impact on the environment.

According to the objects mentioned above, the present invention provides a lighting device for a lamp device, such as a discharge lamp. The lighting device comprises a circuit board; and film capacitors, packaged on the circuit board by using leadless flow solders. In the lighting device, each film capacitor comprises polypropylene films and lead wires, and a material of the lead wires has a thermal conductivity lower than a thermal conductivity of copper. Further, terminals and internal materials of the film capacitors are leadless.

In the aforementioned lighting device, a diameter of the lead wires can be set to 0.6φ (mm) or less. In addition, a cross-sectional area can be set to 35 mm$^2$ or less, and a temperature at a terminal end of the lead wires in the film capacitors during a soldering process is 130° C. or less. Alternatively, the length of the lead wires from the circuit board to the film capacitor is 2 mm or more after the film capacitors are packaged onto the circuit board. In this way, the thermal influence during the soldering of the film capacitors can be reduced.

Furthermore, the film capacitors can be constructed with a combination of a polypropylene film and an aluminum foil. Alternatively, the film capacitors can be also constructed with an aluminum-deposited polypropylene film.

The present invention further provides an illumination apparatus. The illumination apparatus comprises a lamp and a lighting device for lighting the lamp. The lighting device comprises a circuit board; and film capacitors packaged on the circuit board by using leadless flow solders. Each film capacitor comprises polypropylene films and lead wires, and a material of the lead wires has a thermal conductivity lower than a thermal conductivity of copper, and terminals and internal materials of the film capacitors are leadless.

The present invention further provides an illumination system. The illumination system comprises lamps and at least one lighting device for lighting the lamps. The lighting device comprises a circuit board and film capacitors packaged on the circuit board by using leadless flow solders. Each film capacitor comprises polypropylene films and lead wires, and a material of the lead wires has a thermal conductivity lower than a thermal conductivity of copper, and terminals and internal materials of the film capacitors are leadless.

In the aforementioned illumination apparatus or illumination system, the diameter of the lead wires can be set to 0.6φ (mm) or less. In addition, a cross-sectional area of each lead wire can be set to 35 mm$^2$ or less, and a temperature at a terminal end of the lead wires in the film capacitors during a soldering process is 130° C. or less. Alternatively, the length of the lead wires from the circuit board to the film capacitor is 2 mm or more after the film capacitors are packaged onto the circuit board. In this way, the thermal influence during the soldering of the film capacitors can be reduced.

Furthermore, in the aforementioned illumination apparatus or illumination system, the film capacitors can be constructed with a combination of a polypropylene film and an aluminum foil. Alternatively, the film capacitors can be also constructed with an aluminum-deposited polypropylene film.

According to the present invention, a safe lighting device of a discharge lamp can be provided to decrease the temperature applied to the film capacitor during the soldering process. Therefore, for the leadless solder, the capacitance loss against the polypropylene film capacitor due to the soldering heat can be avoided, and the reliability of the film capacitor can be increased. In addition, the cost can be reduced and any negative impact on the environment can be also mitigated.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

The embodiments of the present invention will be descried in details below. The present invention focuses on film capacitors that can be set in a lighting device for a lamp device, such as a discharge lamp. Since the thermal property of the film capacitors is improved as follows, the reliability of the lighting device can be increased. The lighting device includes a circuit board and film capacitors packaged on the circuit board by using leadless flow solders. Each film capacitor comprises polypropylene films and lead wires, and a material of the lead wires has a thermal conductivity lower than a thermal conductivity of copper. Terminals and internal materials of the film capacitors are free of lead, i.e., all metal portions of the film capacitor are leadless. For example, metal layers deposited on the dielectric films, metallic contacts (used as electrodes), lead wires and lead wire solders, etc.

Figure 1:
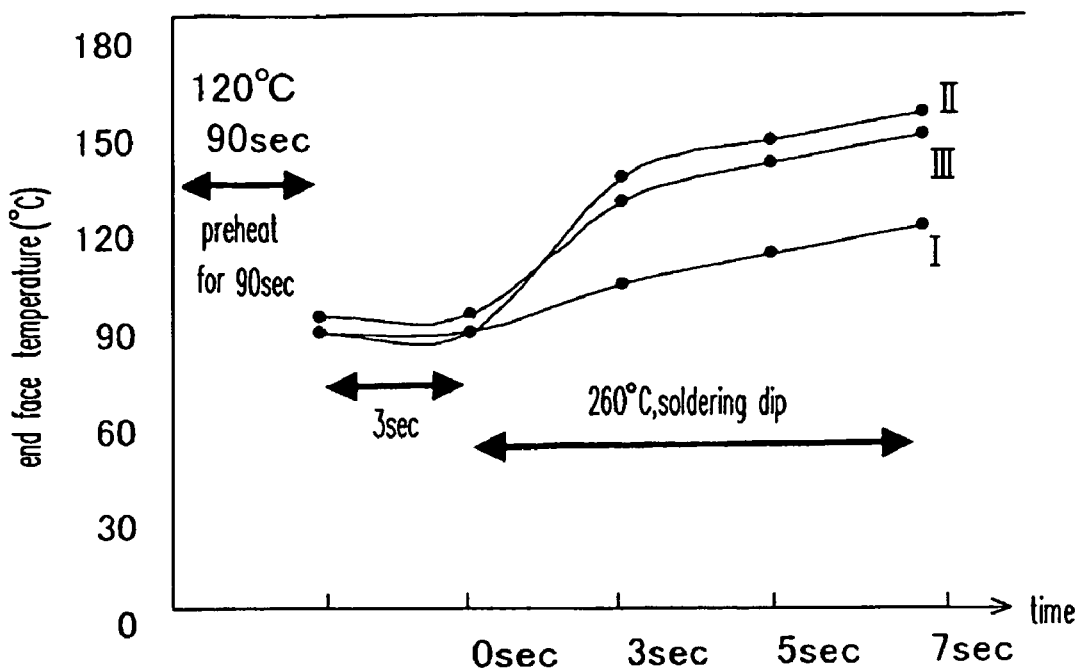
FIG. 1 shows a temperature profile of a film capacitor during the soldering process in which temperature is shown to increase at different positions of the film capacitor.
Figure 2:
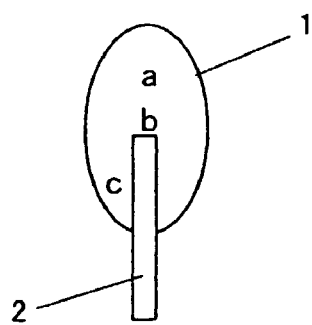
FIG. 2 shows positions on one electrode of the film capacitor where a thermal couple for measuring the temperature of the film capacitor is attached.
Figure 3A:
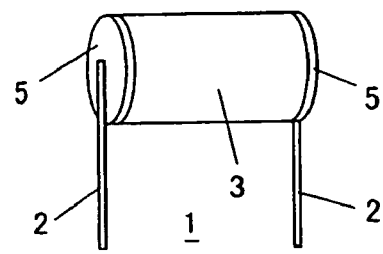
FIG. 3A shows a perspective appearance of a film capacitor.
Figure 3B:
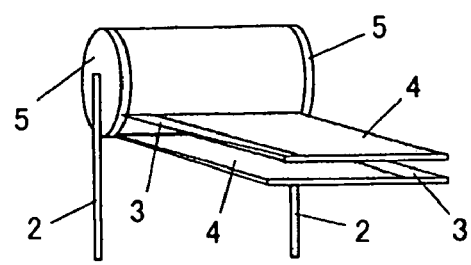
FIG. 3B is a perspective view showing an internal structure of the film capacitor.
Figure 4:
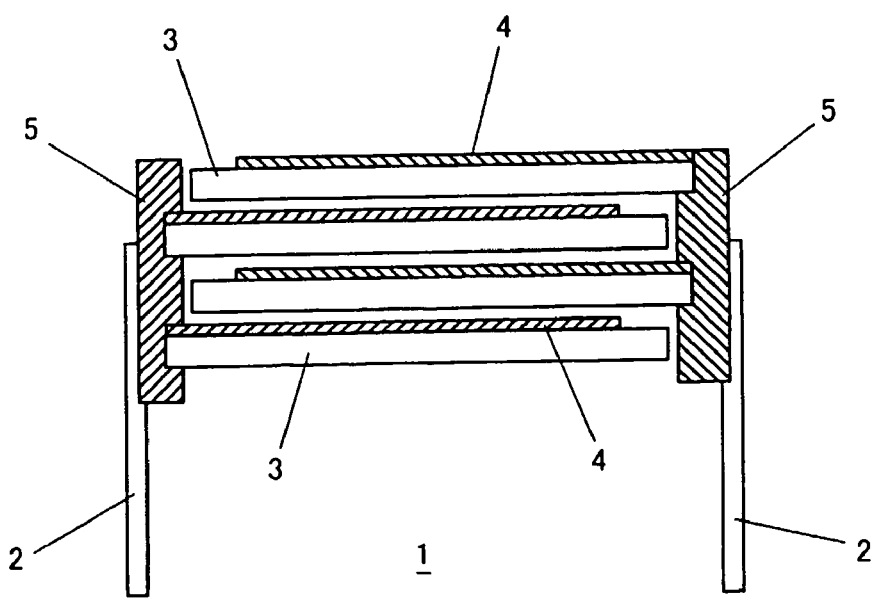
FIG. 4 is a cross-sectional view showing the internal structure of the film capacitor.
Figure 5:
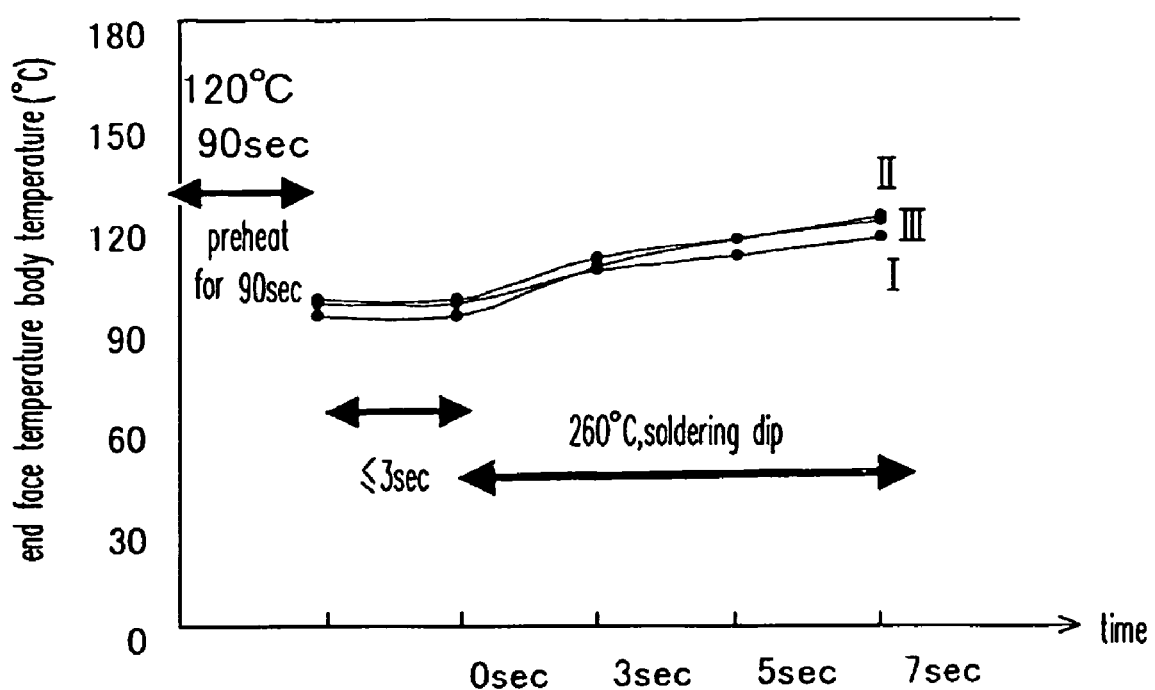
FIG. 5 shows an experiment result according to the first embodiment of the present invention.

FIG. 5 shows an experiment result according to the first embodiment of the present invention. FIG. 5 also shows a temperature profile of the film capacitor shown in FIGS. 2-4, wherein the material of the terminals (lead wires) 2 of the film capacitor 1 are changed from copper wires (Cu) to steel wires (Fe). In the conventional film capacitor as shown in FIG. 1, the temperature at the terminal end is 150° C. According to the first embodiment of the present invention, a material of the lead wires 2 has a thermal conductivity lower than the thermal conductivity of copper (Cu), and a steel wire is used as an example. The temperature at the terminal end can be reduced to 120° C. by changing the material of the lead wires 2 from copper wires (Cu) to steel wires (Fe) because the thermal conductivity of the steel wire (Fe) is lower than that of the copper wire (Cu). In comparison with a thermal conductivity of 395 W/m·K for the copper wire (Cu), the thermal conductivity of the steel wire (Fe) is only 72 W/m·K. Thus, the thermal conductivity of the steel wire (Fe) is about one-fifth of the thermal conductivity of the copper wire (Cu). Therefore, the thermal conduction due to the soldering process can be suppressed.

As described above, by using a material whose thermal conductivity is lower than the thermal conductivity of the copper wire, circuits can be constructed by using polypropylene film capacitors that are adversely affected by the thermal influence caused by the soldering process. Therefore, by using the above lead wires 2 that are also plated without lead (Pb), a safe lighting device of a discharge lamp, which is also lower in cost and has less adverse effect on the environment, can be provided.

The second embodiment according to the present is further discussed as follows. In the first embodiment, the thermal conductivity is decreased since the material of the lead wires is changed from Cu to Fe. However, the thermal influence during the soldering process can be further reduced by making the lead diameter smaller. In the prior art, a copper wire with a diameter of 0.8φ is usually used. In the second embodiment, the temperature at the terminal end of the film capacitor can be further reduced by using a steel wire (Fe) with a diameter of 0.6φ or less. Generally, when the diameter of the lead wire gets smaller, the heat is difficult to be transferred. Therefore, the temperature at the terminal end of the film capacitor can be further reduced. In addition, a cross-sectional area of the film capacitors can be set to 35 mm$^2$ or less.

Next, the third embodiment of the present invention is described. The film material itself of the film capacitor can be also changed for further improving a thermal property of the film capacitor. According to the third embodiment, a high thermal resistant polypropylene is used for the film of the capacitor. Conventionally, the highest operating temperature for a fully-rated capacitor is about 85° C. The fully-rated means that a voltage, a current and a frequency of the capacitor is operated at its rated value (100%), and the rated reduction means that the voltage, the current and the frequency of the capacitor is operated below its rated value (100%), especially in a high temperature environment. However, the Japanese Laid Open Publication H10-156939 (Toray Company) discloses a polypropylene film (a high thermal resistant polypropylene film) or a capacitor using this film to suppress thermal contraction at high temperature, in which the highest operating temperature for the polyproylene film can be further increased. In addition, the Japanese Laid Open Publication H10-119126 discloses a polypropylene film capable of increasing its highest operating temperature by 20° C., and the Japanese Laid Open Publication H5-217799 discloses a metallized capacitor. By using the aforementioned high thermal resistant polypropylene film, not only can an operating temperature of the capacitor be increased, the thermal influence during the soldering process can be reduced also even though the terminal end of the capacitor is high as described in the first embodiment.

TABLE 1

| Film Material | Highest operating temperature for a fully rated capacitor (° C.) | Highest operating temperature for capacitor in a rated reduction use (° C.) | terminal temperature during soldering (° C.) |
| --- | --- | --- | --- |
| ordinary PP | 85 | 105 | 110 |
| high thermal resistant PP | 105 | 125 | 130 |

Table 1 shows a temperature difference at the terminal end of the capacitor due to different capacitor films. By using a high thermal resistant PP film, a thermal resistance of 20° C. higher than the conventional art can be expected. Therefore, since the temperature at the terminal end of the film capacitor during the soldering process is increased in a short period of time, a thermal resistance against a temperature rise of about 125° C. to 130° C. can be considered.

Figure 6:
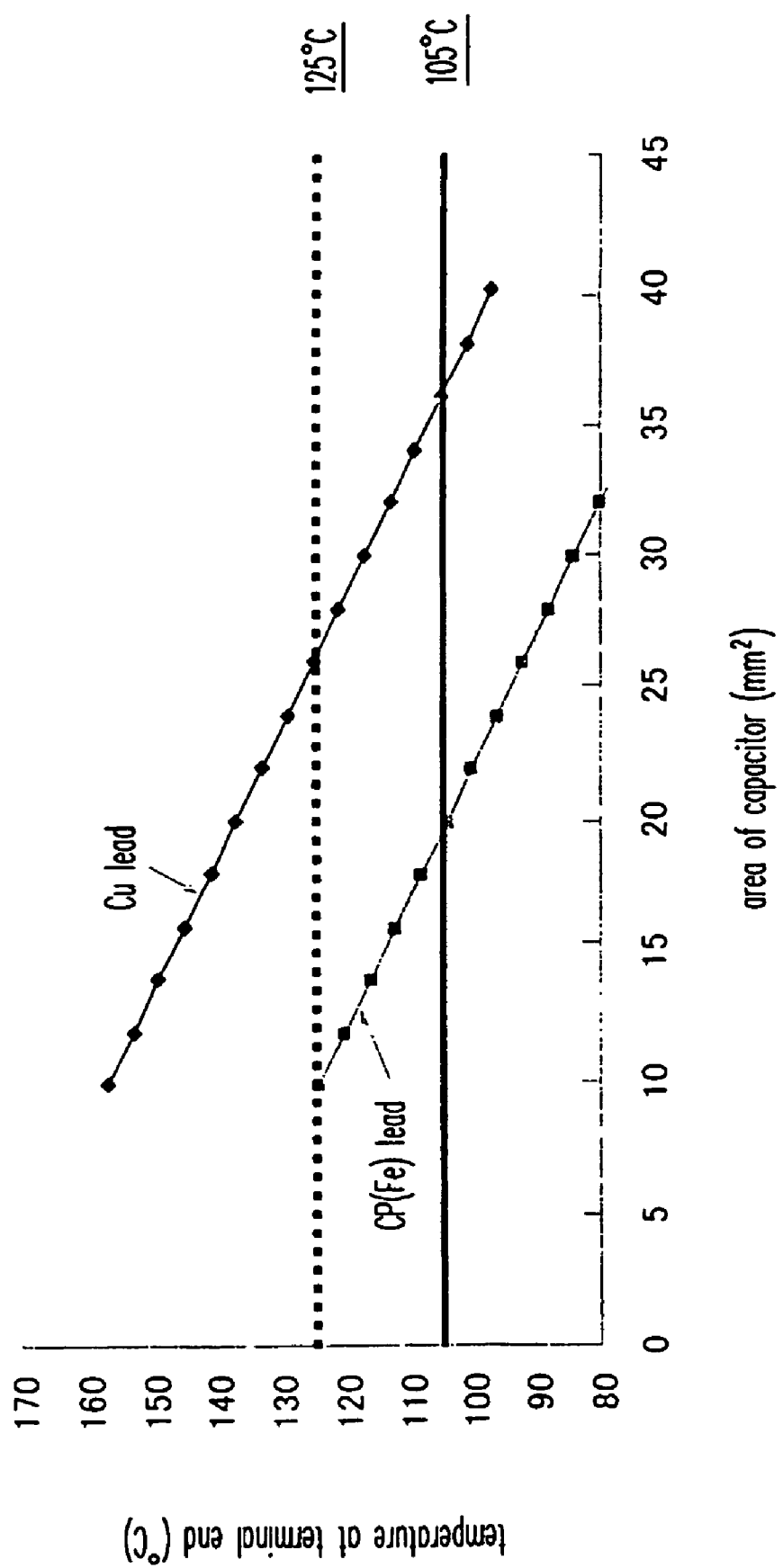
FIG. 6 is a graph showing a temperature at the terminal end of the capacitor with respect to a cross-sectional area of the capacitor.

FIG. 6 is a graph showing a temperature at the terminal end of the capacitor with respect to a cross-sectional area of the capacitor. In FIG. 6, two temperature profiles for respectively using a copper wire (Cu wire) and a copper-clad steel wire (CP wire) are shown. The area of the capacitor means an area of a metallized contact at terminal end of the film capacitor, or an area of an electrode of the capacitor. Referring to FIG. 6, if only the dielectric film is changed to the high thermal resist polypropylene film, the temperature at the terminal end of the Cu lead wire might exceed the upper limit temperature 125° C. when the cross-sectional area is less than 25 mm$^2$. However, when the material of the lead wires is changed to the steel wire (Fe), even though an ordinary polypropylene film is used, the temperature at the terminal end of a film capacitor with a smaller cross-sectional area can be within the upper limit of 105° C. In addition, if the film capacitor is made by using the high thermal resist polypropylene film and the Fe lead wires, the thermal property of the film capacitor is significantly improved.

In summary, if the temperature is not reduced sufficiently by only changing the material of the lead wires, the temperature will exceed 105° C. as indicated by the solid line in FIG. 6, which is an upper limit temperature for an ordinary polypropylene film. However, by using the high thermal resist polypropylene film, even though in a region where the temperature at the terminal end of the capacitor is not decreased, the temperature can be less than 125° C. The dash line in FIG. 6 depicts an upper limit temperature for the high thermal resistant polypropylene. Therefore, the soldering thermal resistance can be sufficiently maintained.

Figure 7A:
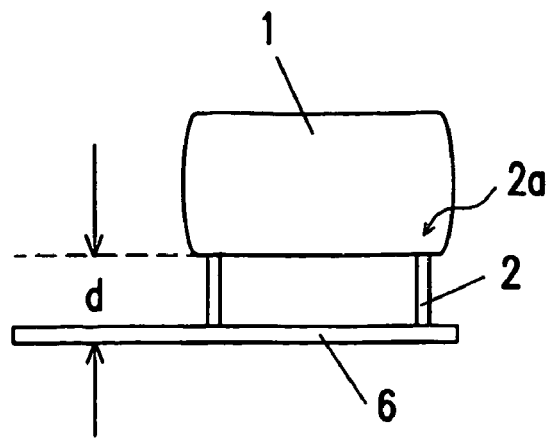
FIGS. 7A-7C illustrate the forth embodiment of the present invention, showing that the capacitor is mounted on a circuit board or a substrate.
Figure 7B:
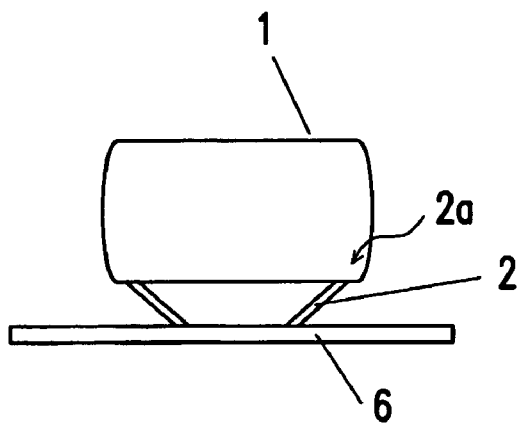
Figure 7C:
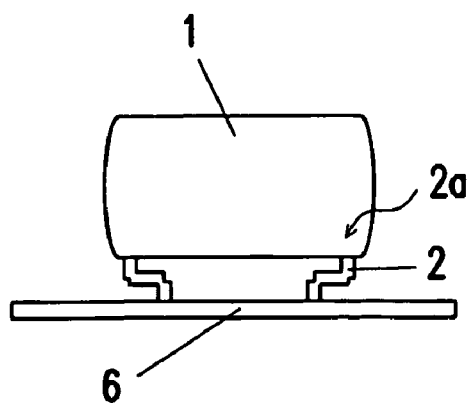

FIGS. 7A-7C illustrate the fourth embodiment of the present invention, showing that the capacitor is mounted on a circuit board or a substrate. In the fourth embodiment, the bared portion of the lead wires 2 of the capacitor 1 is maintained at 2 mm or more. Therefore, a temperature rise at the terminal end of the capacitor can be reduced by 3° C. or more during the soldering process. FIGS. 7A-7C shows three examples based on the concept of the fourth embodiment. These example are not used to limit the scope of the present invention, other variation can be made under the concept for people skilled in this art.

FIG. 7A shows the first example of the fourth embodiment. In FIG. 7A, the capacitor 1 with the lead wires 2 is vertically mounted on the circuit board 6. A gap "d" between the capacitor 1 and the circuit board 6 is 2 mm or more. Due to a heat gradient in the gap, a temperature rise at the terminal end can be reduced during the soldering process. FIG. 7B shows the second example of the fourth embodiment. As shown in FIG. 7B, the lead wires 2 are packaged with the capacitor 1 and extended at an inclination, and are mounted on the circuit board 6 also at an inclination. The length of the inclined lead wires 2, i.e., the bared portion of the lead wires 2 is 2 mm or more. In this way, a heat gradient is created between the capacitor 1 and the circuit board 6. Due to the heat gradient, a temperature rise at the terminal end can be reduced during the soldering process. FIG. 7C shows the third example of the fourth embodiment. As shown in FIG. 7C, the lead wires 2 are bent into a crank shape and packaged with the capacitor 1. After the capacitor 1 is mounted to the circuit board 6, the total length of bared portion of the lead wires 2 is kept at 2 mm or more. In this way, a heat gradient is created between the capacitor 1 and the circuit board 6. Due to the heat gradient, a temperature rise at the terminal end can be reduced during the soldering process. The thermal conductivity of a material is equivalent to the quantity of heat that passes in unit time through unit area of a plate, when its opposite faces are subject to unit temperature gradient (e.g. one degree temperature difference across a thickness of one unit). Therefore, if the diameter or the length of the lead wires is changed, the temperature gradient will change. In the fourth embodiment, since the length of the bared portion of the lead wires 2 is 2 mm or more, the heat gradient is sufficient to decrease the temperature rise at the terminal end of the film capacitor 1.

Figure 8:
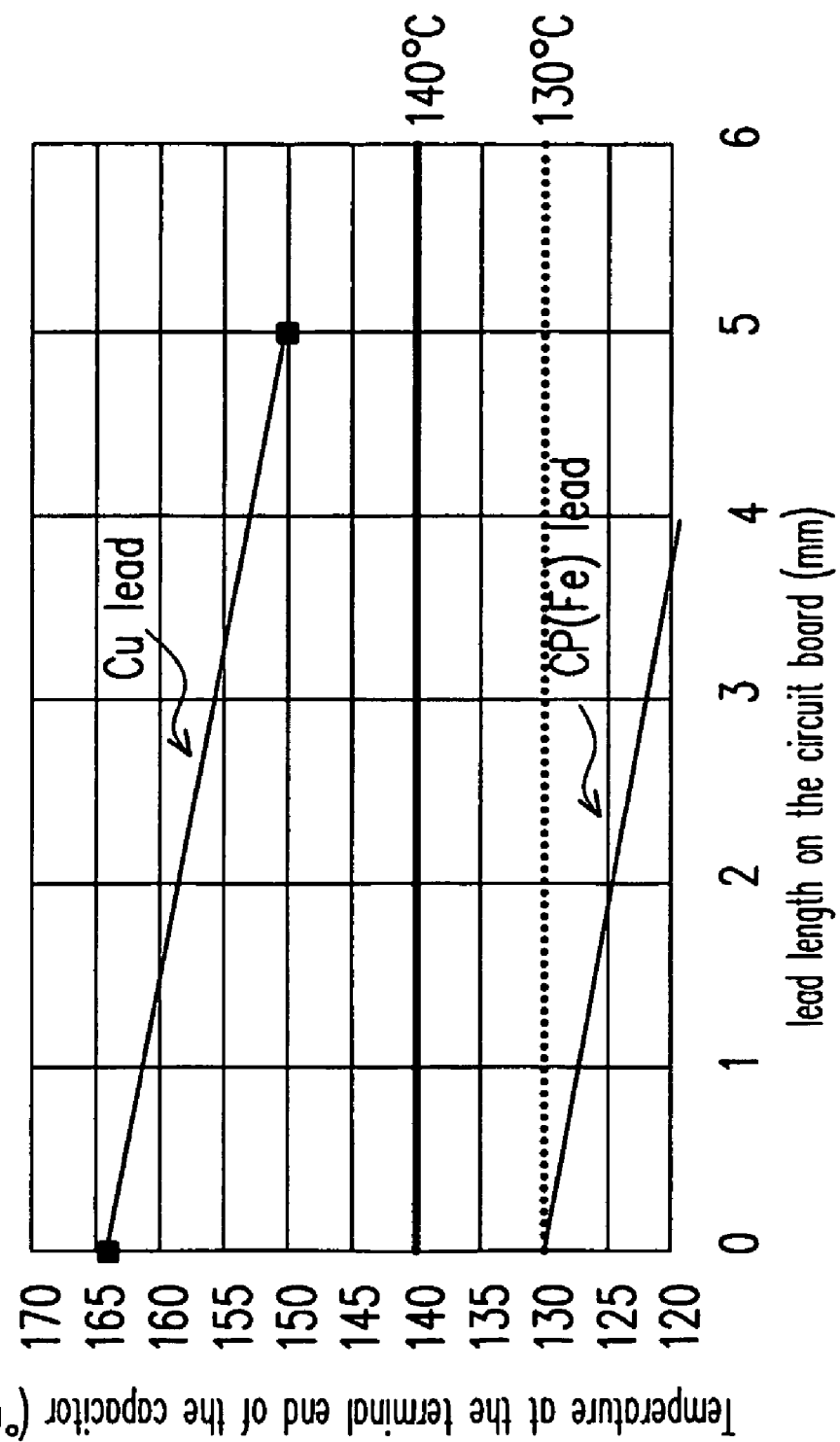
FIG. 8 is a graph showing the temperature profiles at the terminal end of the film capacitor with respect to a length of the terminal of the film capacitor.

FIG. 8 is a graph showing the temperature profiles at the terminal end of the film capacitor with respect to a length of the terminal of the film capacitor, in which cases the use of the Cu wire and the CP wire as the lead wires are depicted and the cross-section area of the film capacitor is 10 mm². The soldering condition of the experiment shown in FIG. 8 is preheating at 120° C. for 90 seconds and soldering dip at 260° C. for 7 seconds. In FIG. 8, a bold line indicates an upper limit temperature (140° C.) at the terminal end of the film capacitor according to a reliability test, and a dash line indicates an upper limit temperature (130° C.) at the terminal end of the film capacitor obtained from a margin according to the reliability test data. Referring to FIG. 8, the temperature at the terminal end of the film capacitor with the Cu leads (the Cu wire) is higher than that with the CP (Fe) leads (the CP (Fe) wire) by about 30° C. Furthermore, for the Cu lead wires, the temperature at the terminal end of the film capacitor is always higher than the upper limit temperature 140° C., even though the lead length is set to 2 mm or more. For the CP lead wires, the temperature at the terminal end of the film capacitor is kept below the upper limit temperature 130° C. as indicated by the dash line.

In addition, as the length of the lead wires becomes longer, the temperature at the terminal end becomes lower. A temperature difference of about 2.8° C. per 1 mm (lead length) will be created at the terminal end of the film capacitor. Therefore, in the fourth embodiment, the temperature at the terminal end of the film capacitor is reduced by about 6° C. when the lead length on the circuit board is set to 2 mm. If the margin is reduced by half, a temperature reduction effect of about 3° C. or more per 2 mm (lead length) is resulted.

TABLE 2

| Temperature at the terminal end of the film capacitor (° C.) | Electrical property after soldering | Electrical property after a heat cycle |
| --- | --- | --- |
| 149 | X, C, D | — |
| 148 | X, C | — |
| 145 | X, C | — |
| 140 | O | O |
| 135 | O | O |

Table 2 shows a reliability test result according to the temperature at the terminal end of the film capacitor. The criteria for judging the electric property is that a variation of the capacitance is within ±3% and a variation of the dielectric dissipation factor (tan δ) is 200% or less. The heat cycle is 1050 cycles from −40° C. to 110° C. In Table 2, the mark "X" indicates failure, the mark "D" indicates a failure of the variation of dielectric tangent (tan δ), and the mark "C" indicates a failure of the capacitance variation.

The heat cycle is implemented based on the lifetime of an inverter. From Table 2, when the temperature at the terminal end reaches 145° C. or higher, the electric property of the film capacitor after soldering fails. In contrast, the electric property after soldering and the heat cycle is good when the temperature at the terminal end is 140° C. or lower. According to the result, the highest temperature during the soldering process is preferably set at 140° C. for reliability. However, if considering the nonuniformity of parts and the ambient temperature during the soldering process, a margin of 10° C. shall be taken into consideration. Therefore, the highest upper limit temperature during soldering could be set at 130° C. Referring to FIG. 8, if the CP (Fe) wire is used and the upper limit temperature 130° C. is set for a lead length of 0 mm, the temperature at the terminal end of the film capacitor would be reduced to about 125° C. by setting the lead length to 2 mm.

Figure 9:
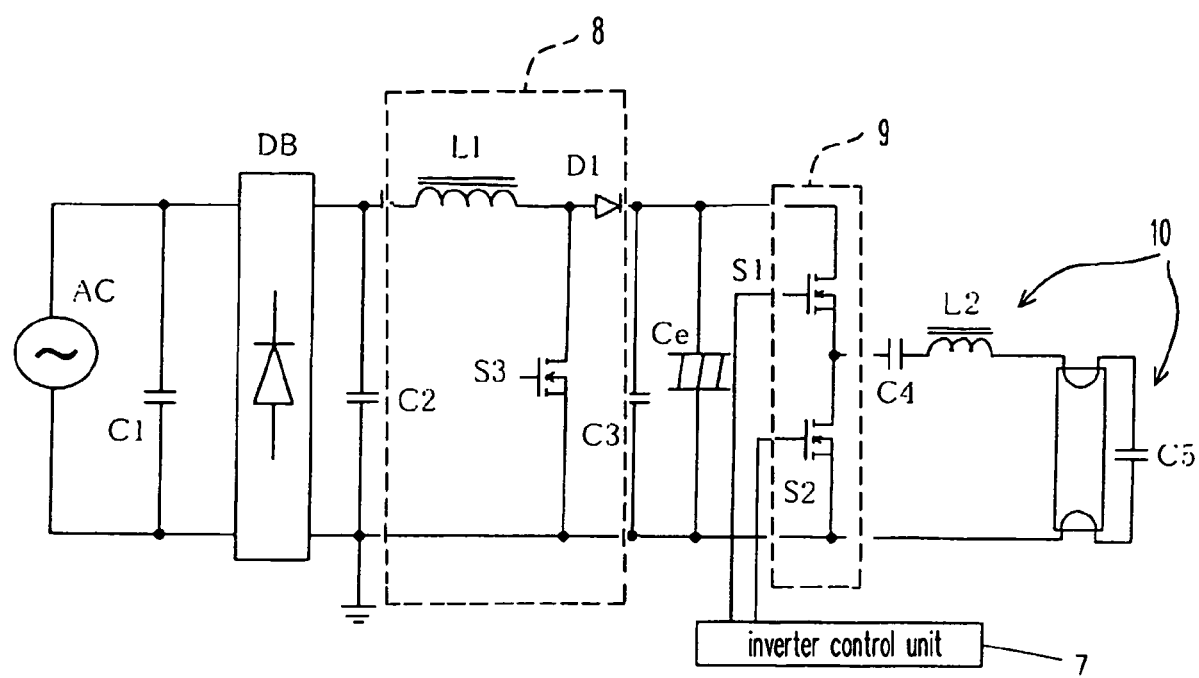
FIG. 9 is a main circuit diagram of a typical lighting device for a discharge lamp according to the fifth embodiment of the present invention.

FIG. 9 is a main circuit diagram of a typical lighting device for a discharge lamp of the fifth embodiment of the present invention. For example, the discharge lamp can be a fluorescent lamp. In the eighth embodiment, a lighting device using the aforementioned capacitors are described. The lighting device comprises a capacitor C1, a diode bridge DB, a capacitor C2, a chopper circuit 8, capacitors C3 and Ce, an inverter circuit 9, a capacitor C4, a resonant circuit 10 and an inverter control unit 7. The chopper circuit consists of an inductor L1, a switch element S3 and a diode D1. The inverter circuit consists of switch elements S1, S2. The resonant circuit consists of an inductor L2 and a capacitor C5. The alternating current (AC) power source AC is filtered by the capacitor C1 and then rectified by the diode bridge DB. The rectified AC voltage is further filtered by the capacitor C2 and smoothly increased by the chopper circuit 8. The inverter control unit 7 alternatively turns on and off the switch elements S1, S2. The discharge lamp FL is lit by the resonant circuit 10. The lighting device shown in FIG. 9 is only an example. Any circuit structure of the lighting device can be within the scope of the present invention if the film capacitors of the lighting device has the structure as described in the present invention.

In FIG. 9, the capacitor C1, C2 are used as filters, and polyethylene terephthalate film capacitors are generally used. However, in the eighth embodiment, metallized polypropylene film capacitors for increasing the thermal resistance are used for the capacitor C1, C2. The capacitor C3, Ce are used to smooth the voltage from the chopper circuit. Similarly, metallized polypropylene film capacitors are also used as the capacitor C3, Ce. The capacitor C4 is used to cut off a DC component, and can use a metallized polypropylene film capacitor. The capacitor C5 is used for the resonant circuit 10. For increasing a voltage across the discharge lamp FL, the film capacitor can be constructed by a combination an aluminum foil and a polypropylene film, or a metallized polypropylene film capacitor is used. The metallized polypropylene film can be an aluminum-deposited film, for example. For the capacitor with the combination structure of an aluminum foil and a polypropylene film, since the polypropylene film is used similar to the metallized film capacitor, the temperature at the terminal end of the film capacitor during the leadless flow soldering process can be reduced to 130° C. or less by using the high thermal resistant polypropylene film or by properly selecting a lead diameter, a lead material and a lead length. Therefore, a capacitance loss due to the heat created in the soldering process and a reduction in the reliability can be avoided.

The above lighting device of the discharge lamp can be built in illumination apparatus for office or home use, and can be used as a high reliable illumination apparatus. In addition, a plurality of illumination apparatuses of the present invention can be combined to construct a high reliable illumination system.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A lighting device for a lamp device, comprising:
   a circuit board; and
   film capacitors, packaged on the circuit board by using leadless flow solders,
   wherein each film capacitor comprises polypropylene films and lead wires, and a material of the lead wires has a thermal conductivity lower than a thermal conductivity of copper, and terminals and internal materials of the film capacitors are leadless;
   wherein the film capacitors are constructed by a combination of a polypropylene film and an aluminum foil, or an aluminum-deposited polypropylene film.

2. The lighting device of claim 1, wherein a diameter of the lead wires is 0.6φ (mm) or less.

3. The lighting device of claim 1, wherein a cross-sectional area of the film capacitors is 35 mm$^2$ or less, and a temperature at a terminal end of the lead wires in the film capacitors during a soldering process is 130° C. or less.

4. The lighting device of claim 1, wherein a length of the lead wires from the circuit board to the film capacitor is 2 mm or more after the film capacitors are packaged onto the circuit board.

5. The lighting device of claim 1, wherein circuit elements set on the circuit board are all leadless.

6. An illumination apparatus, comprising:
   a lamp; and
   a lighting device for lighting the lamp,
   wherein the lighting device comprises a circuit board; and film capacitors packaged on the circuit board by using leadless flow solders, wherein each film capacitor comprises polypropylene films and lead wires, and a material of the lead wires has a thermal conductivity lower than a thermal conductivity of copper, and terminals and internal materials of the film capacitors are leadless;
   wherein the film capacitors are constructed by a combination of a polypropylene film and an aluminum foil, or an aluminum-deposited polypropylene film.

7. The illumination apparatus of claim 6, wherein a diameter of the lead wires is 0.6φ (mm) or less.

8. The illumination apparatus of claim 6, wherein a cross-sectional area is 35 mm$^2$ or less, and a temperature at a terminal end of the lead wires in the film capacitors during a soldering process is 130° C. or less.

9. The illumination apparatus of claim 6, wherein a length of the lead wires from the circuit board to the film capacitor is 2 mm or more after the film capacitors are packaged onto the circuit board.

10. The illumination apparatus of claim 6, wherein circuit elements set on the circuit board are all leadless.

11. An illumination system, comprising:
    lamps; and
    at least one lighting device for lighting the lamps;
    wherein the lighting device comprises a circuit board; and film capacitors packaged on the circuit board by using leadless flow solders, wherein each film capacitor comprises polypropylene films and lead wires, and a material of the lead wires has a thermal conductivity lower than a thermal conductivity of copper, and terminals and internal materials of the film capacitors are leadless;
    wherein the film capacitors are constructed with a combination of a polypropylene film and an aluminum foil, or an aluminum-deposited polypropylene film.

12. The illumination system of claim 11, wherein a diameter of the lead wires is 0.6φ (mm) or less.

13. The illumination system of claim 11, wherein a cross-sectional area is 35 mm$^2$ or less, and a temperature at a terminal end of the lead wires in the film capacitors during a soldering process is 130° C. or less.

14. The illumination system of claim 11, wherein a length of the lead wires from the circuit board to the film capacitor is 2 mm or more after the film capacitors are packaged onto the circuit board.

15. The illumination apparatus of claim 11, wherein circuit elements set on the circuit board are all leadless.

* * * * *